United States Patent
Yokoshima

4,083,006
Apr. 4, 1978

[54] LOOP TYPE STANDARD MAGNETIC FIELD GENERATOR

[75] Inventor: Ichiro Yokoshima, Tokyo, Japan

[73] Assignee: Agency of Industrial Science & Technology, Tokyo, Japan

[21] Appl. No.: 658,769

[22] Filed: Feb. 17, 1976

Related U.S. Application Data

[63] Continuation-in-part of Ser. No. 487,198, Jul. 10, 1974, abandoned.

[30] Foreign Application Priority Data

Jul. 10, 1973 Japan .................................. 48-77091
Jul. 28, 1973 Japan .................................. 48-84578

[51] Int. Cl.² ............................................. H04B 1/04
[52] U.S. Cl. ..................................... 325/125; 325/67; 325/133; 325/363; 343/703; 343/842
[58] Field of Search ................. 325/67, 133, 134, 160, 325/178, 179, 363, 125; 343/703, 732, 842, 850, 852; 331/44, 74, 75; 324/58 A, 62 R

[56] References Cited
U.S. PATENT DOCUMENTS

| | | | |
|---|---|---|---|
| 3,296,533 | 1/1967 | Karpinsky | 325/363 |
| 3,332,019 | 7/1967 | Leostic et al. | 325/363 |
| 3,902,177 | 8/1975 | Mori et al. | 343/842 |

*Primary Examiner*—Robert L. Griffin
*Assistant Examiner*—Jin F. Ng
*Attorney, Agent, or Firm*—Oblon, Fisher, Spivak, McClelland & Maier

[57] ABSTRACT

In a loop type standard magnetic field generator comprising loop within which a transmission line having an inner conductor and an outer conductor is coaxially provided and an oscillator for feeding a signal to the loop through the transmission line, the magnetic field strength at a given point is obtained, irrespective of the signal frequency, from the indicated value of an indicator connected to the loop via the transmission line and an element connected thereto, by choosing the length of the transmission line and/or the impedance of the element so that the frequency characteristic of the ratio of the indicated value of the indicator to the electric current flowing through the loop is cancelled by the frequency characteristic of the ratio of the electric current flowing through the loop to the magnetic field strength at the given point to thereby make the frequency characteristic of the indicated value of the indicator and the magnetic field strength constant.

8 Claims, 12 Drawing Figures

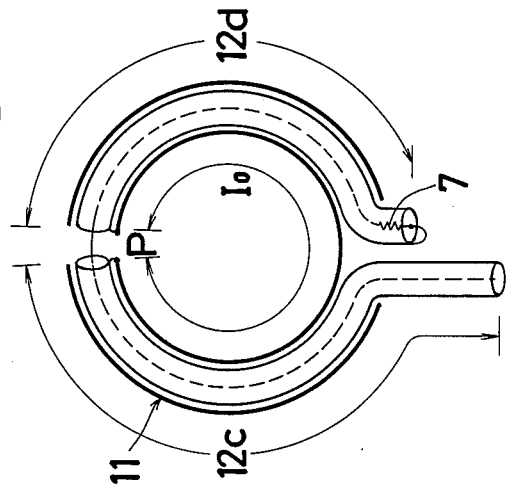
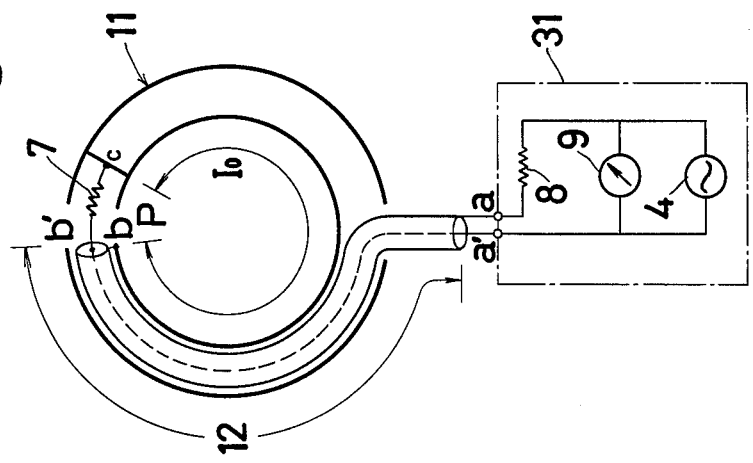
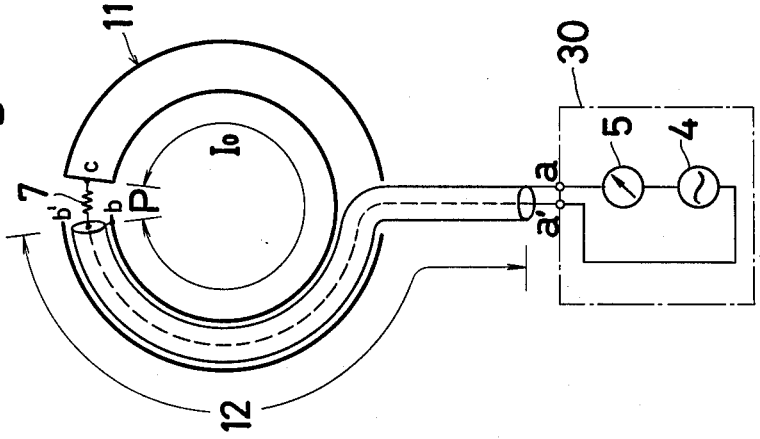
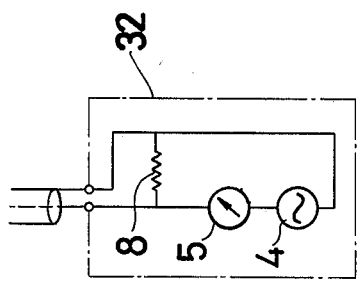
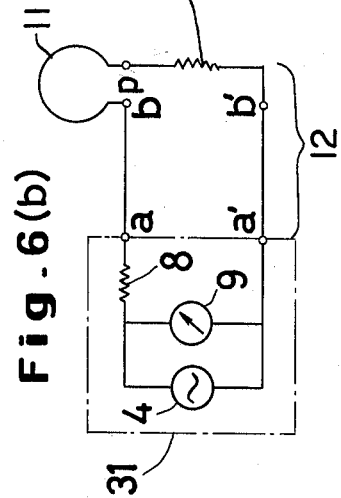
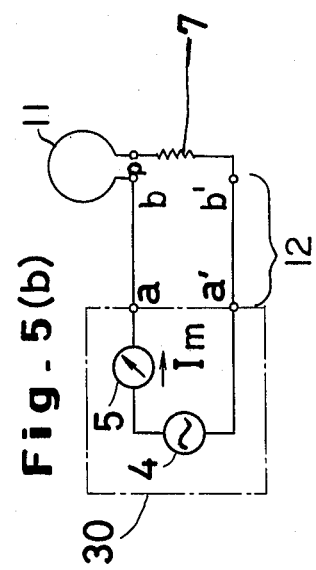

LOOP TYPE STANDARD MAGNETIC FIELD GENERATOR

REFERENCE TO RELATED APPLICATION

This is a continuation-in-part of our copending application Ser. No. 487,198 filed July 10, 1974, now abandoned.

BACKGROUND OF THE INVENTION

The present invention relates to a loop type standard magnetic field generator providing a constant ratio of magnetic field strength to release voltage independent of signal frequency over a wide frequency range covering both low and high frequencies.

It has been known that corrections of indicated values of measuring devices such as electric field intensity measuring devices or interference wave measuring devices, or sensitivity tests of devices such as radio frequency receivers, all of which utilize loop antennas or bar antennas, are generally performed by using a standard magnetic field generated by a loop type standard magnetic field generator.

One typical example of a conventional loop type standard magnetic field generator for this purpose comprises a standard loop antenna constituted of a loop within which a transmission line having an outer conductor and an inner conductor electrostatically shielded by the outer conductor is coaxially provided and a terminal resistor through which one end of the inner conductor is connected to the loop, and an oscillator for feeding a signal to the loop antenna via the transmission line.

In the loop type standard magnetic field generator constructed in this way, the magnetic field strength at a given point in the magnetic field generated by the standard loop antenna thereof is determined by the release voltage of the oscillator, the configuration of the standard loop antenna and the distance between the loop antenna and said point. It has been known that although the ratio of the magnetic field strength of the standard magnetic field to the release voltage is substantially constant for the relatively low frequency range, it varies with change of frequency in the higher frequency range due to the transmission characteristics of the space between the standard loop and the point of measurement, the self-inductance of the loop and the stray capacitance existing between the inner conductor and the shielding conductor of the loop, etc.

For this reason, the conventional loop type standard magnetic field generator has an inherent disadvantage that the measuring accuracy in the high frequency band is degraded. Although this degradation may be overcome in various ways, it is impossible to avoid sophisticated testing and correcting procedures in doing so.

A primary object of the present invention is to provide a loop type wide band standard magnetic field generator providing a substantially constant ratio of magnetic field strength to indicated value of an indicator independently of the output frequency of the signal oscillator.

SUMMARY OF THE INVENTION

In order to achieve the foregoing object, the present invention provides a loop type standard magnetic field generator which comprises a loop having a signal-feeding point thereon, a feeding line one end of which is connected to the loop at one edge of the feeding point, an oscillator connected to the other end of the feeding line, a compensation circuit composed of an indicator for measuring the signal supplied from the oscillator to the loop and a compensation resistor and a transmission line connected to the loop at the other edge of the feeding point in such a manner that the length of the transmission line and/or the value of the compensation resistor are selected so that the frequency characteristic of a ratio of the indicated value of the indicator to a loop current flowing through said loop is cancelled by the frequency characteristic of a ratio of the loop current to a magnetic field strength at a given point. As a result, the ratio of the indicated value of the indicator to the magnetic field strength becomes uniform in frequency characteristic and thus the magnetic field strength at such given point can be obtained from the indicated value of the indicator irrespective of frequency.

BRIEF DESCRIPTION OF THE DRAWING

FIGS. 5(a) and 5(b) are a schematic illustration of another embodiment of the present loop type standard magnetic field generator and an equivalent circuit thereof;

FIGS. 6(a) and 6(b) are a schematic illustration of a further embodiment of the present loop type standard magnetic field generator and an equivalent circuit thereof; and FIGS. 7 and 8 are explanatory illustrations of further embodiments of the present invention.

DETAILED DESCRIPTION OF THE INVENTION

Figure 1A:
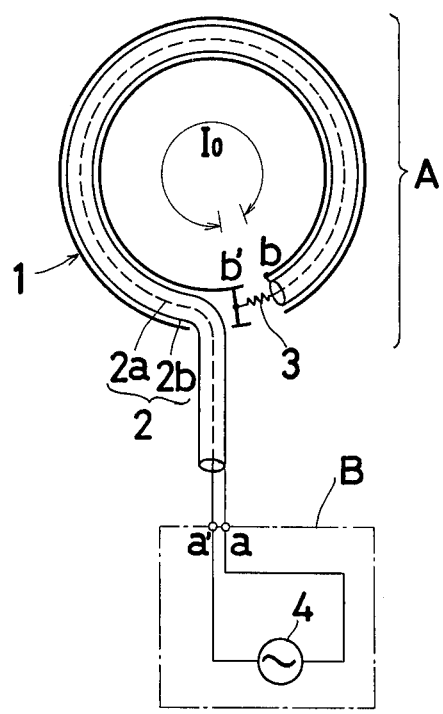
FIGS. 1(a) and 1(b) are explanatory illustration of one example of a conventional loop type standard magnetic field generator and an equivalent circuit thereof.
Figure 1B:
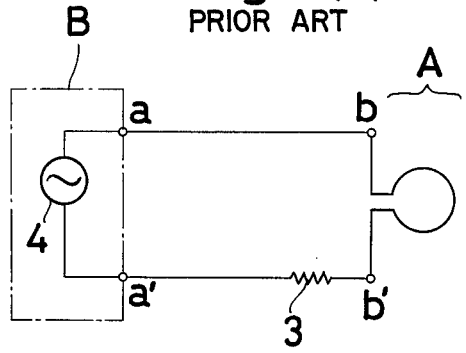

An explanation of one example of the conventional loop type standard magnetic field generator will be given in reference to FIG. 1.

the example is constituted of a standard loop antenna "A" having loop 1 formed of a uniform metal tube, a transmission line 2 having an inner conductor 2a and an outer conductor 2b, which is coaxially provided within the loop and a resistor 3 through which the loop 1 is connected to the inner conductor 2a at feeding points b and b' on the loop and a signal generator "B" for feeding a signal to the antenna "A" from the output terminals a and a'. There is shown in FIG. 1(b) an equivalent circuit of the loop type standard magnetic field generator shown in FIG. 1(a).

Figure 2:
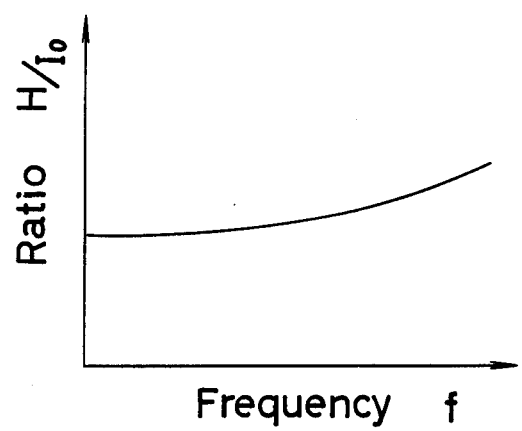
FIG. 2 is a graph showing the frequency characteristic of the ratio of magnetic field strength to electric current flowing through a loop of a standard magnetic field generator.

As mentioned previously, the magnetic field strength of the magnetic field generated by the loop antenna "A" of the conventional standard magnetic field generators is determined by the release voltage of the signal generator "B", the configuration of the antenna "A" and the distance between the antenna and a point of measurement at which tests are to be performed. Although as shown in FIG. 2 the ratio of the strength of the standard magnetic field to the release voltage of the generator "B" is substantially constant for relatively low frequencies, it varies remarkably with change of frequency at higher frequencies due to the transmission characteristics of the space between the loop 1 and the measuring point, the self-inductance of the loop 1 and the stray capacitance of the coaxial transmission line within the loop 1, etc.

Figure 3:
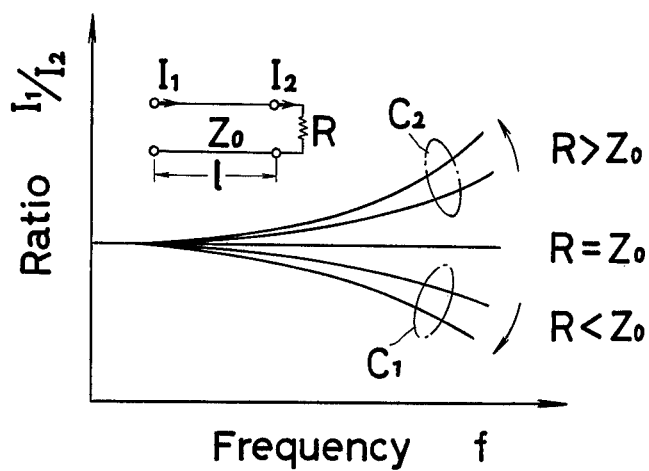
FIG. 3 is a graph showing the frequency characteristic of the ratio of an input current "$I_1$" to an output current "$I_2$" on a transmission line.

In general, the ratio of magnetic field strength "H" generated by the standard loop antenna to electric current "$I_o$" flowing through the loop is given by the following equation.

$$\frac{H}{I_o} = K \sqrt{1 + \left(\frac{2\pi f d}{c}\right)^2} \quad (1)$$

wherein "$d$" is the distance between the standard loop antenna and a loop antenna installed at a measuring point, "$K$" is the proportional constant depending upon the position of the loop antenna at the measuring point, "$I_o$" is the electric loop current flowing through the standard loop, "$f$" is the signal frequency to be fed to the standard loop and "$c$" is the velocity of light in air. On the other hand, the ratio of a current "$I_1$" on one end of a transmission line being uniform in characteristic impedance whose length is shorter than a signal wavelength, to a current "$I_2$" on the other end thereof, i.e., $I_1/I_2$, varies with frequency as shown in FIG. 3, the variation being substantially analogous to the frequency characteristic of the ratio $H/I_o$ for practically usable range of the conventional loop type standard magnetic field generator, and the magnitude of the variation of the ratio $I_1/I_2$ is dependent upon the length "$l$" of the transmission line and the impedance "$R$" of the load connected thereto.

That is to say, when the characteristic impedance $Z_o$ of the load is smaller than that of the transmission line having the length "$l$", the ratio $I_1/I_2$ varies as shown by curves $C_1$ and on the contrary, when the impedance $Z_o$ of the load is larger than that of the transmission line, the ratio $I_1/I_2$ varies as shown by curves $C_2$.

Accordingly, when an indicator such as high frequency ammeter and a high frequency resistor both of which have uniform frequency characteristics respectively are connected to the loop antenna through a transmission line small in loss and uniform in impedance and the length "$l$" of the transmission line and/or the impedance "$R$" of the resistor connected thereto is regulated such that, within a desired high frequency range and within a tolerance of error, the frequency characteristic of the ratio of the loop current flowing through the indicator to the current flowing through the loop antenna and the frequency characteristic of the ratio of the loop current to the magnetic field strength at a desired point cancel each other, the ratio of the magnetic field strength to the current flowing through the indicator will become uniform in frequency characteristic and therefore it will become possible to determine the magnetic field strength at the desired point from the indicated value of the indicator irrespective of the frequency. In this way, it is possible to remove the factors which impede the uniformity of frequency characteristic over a wide frequency range.

Figure 4A:
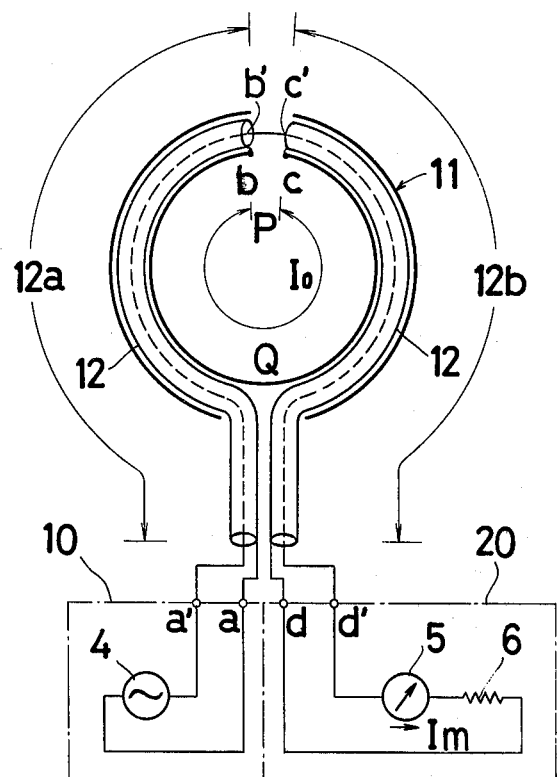
FIGS. 4(a) and 4(b) are a schematic illustration of an embodiment of the present loop type standard magnetic field generator and an equivalent circuit thereof.
Figure 4B:
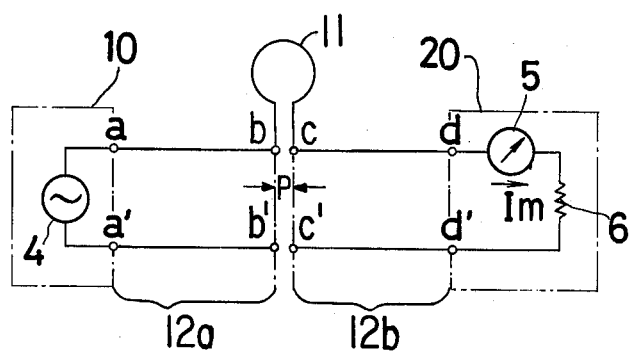

FIG. 4(a) shows an embodiment of the loop type standard magnetic field generator constructed in accordance with the abovementioned principle of the present invention and FIG. 4(b) is an equivalent circuit of the embodiment in FIG. 4(a).

A loop 11 is formed of a metal tube which is uniform in inductance, a portion of which is cut away to form two paired feeding points "P", one end of each wire of a two-wire feeding line 12a is connected to one end $b$, $b'$ of one of the feeding points P, and one end of each wire of a two-wire transmission line 12b for compensating frequency characteristics is connected to the other end $c$, $c'$ of the other of the feeding points P. A coaxial cable having uniform characteristic impedance is applicable to both the feeding line 12a and the transmission line 12b. The feeding line 12a and the transmission line 12b are passed through the inner cavities of the respective halves of the loop and extended outwardly from a point "Q" on the loop which is out-of-phase from the feeding points "P" by 180° along an extension of a line connecting the points "P" and "Q". The other ends of two-wires of the feeding line 12a are respectively connected to two terminals $a$, $a'$ of a signal generation circuit 10 which is mainly composed of an oscillator 4 and the other ends of two-wires of the transmission line 12b are respectively connected to two terminals $d$, $d'$ of a frequency compensation circuit 20 which is mainly composed of an indicator 5 and a compensation resistor 6. A high frequency ammeter is used as an indicator and arranged in series relative to the compensation resistor 6. Accordingly, the loop, the two-wire feeding line 12a and the two-wire transmission line 12b are disposed symmetrically about the line P-Q, so that the current distributions on the symmetrical portions of the loop 11 become equal and the loop becomes capable of preventing undesirable radiations from occuring.

In this embodiment, a high frequency signal generated by the oscillator 4 is supplied through the feeding line 12a to the feeding points P and then passes along the loop 11 causing a loop current "$I_o$" to flow therealong to thereby produce a magnetic field. Further, a current "$I_m$" which is proportional to the loop current "$I_o$" flows through the resistor 6 in compensation circuit 20 and the high frequency ammeter 5 connected to the transmission line 12b.

In this embodiment, in case where the impedance "$Z_L$" of the series circuit of the high frequency ammeter 5 and the resistor 6 is smaller than the characteristic impedance "$Z_o$" of the transmission line 12b, the ratio $I_o/I_m$ varies as shown by curves $C_1$ in FIG. 3.

The frequency characteristic of magnetic field strength as shown in FIG. 2 is cancelled out by the above characteristic effect of the loop antenna to thereby make the frequency characteristic of magnetic field strength uniform.

Therefore, by selecting the value of impedance $Z_L$ of circuit and the length of the transmission line 12b between the feeding point P and the high frequency ammeter 5 such that the ratio $H/I_m$ becomes uniform in frequency characteristic for the magnetic field strength "H" at a given point, a standard magnetic field generator having a wide range characteristics is obtained.

In this embodiment, the oscillator 7 may have either variable or constant output voltage and frequency.

Further, by connecting a bolometer rather than the combination of high frequency ammeter 5 and the resistor 7 and using it as one side element of an automatic balance type bridge circuit, it is possible to measure a current $I_1$ flowing through the side element and, at the same time, by varying values of D.C. resistors constituting the removing side elements of the same bridge, it is advantageously possible to change the resistance value of the bolometer arbitrarily.

With this arrangement, it becomes possible to constitute a standard magnetic field generator in which the resistance value of the bolometer can be controlled in accordance with the distance from the loop such that the ratio $H/I_m$ becomes uniform in frequency characteristic.

FIG. 5(a) illustrates another embodiment of the present invention and FIG. 5(b) shows an equivalent circuit thereof, in which one end of one wire of a feeding line 12 is connected to one end of a signal feeding points P of loop 11 and the other end of one wire thereof is connected to the other end of signal feeding points through a terminal resistor 7 and each other end of feeding line 12 is connected to the terminals a, a' of a feeding circuit 30 composed of an oscillator 4 and an ammeter 5 used as an indicator. In this embodiment, the length of the feeding line 12 and the value of the resistor 7 are selected such that the ratio $H/I_m$ is uniform in frequency characteristic at a given position.

As mentioned above, since, in the present invention, the loop current is measured by the ammeter connected to the loop through the feeding line 12 and the length of the feeding line and the impedance of the resistor 7 are selected such that the ratio of the magnetic field strength at a given point to the current flowing through the ammeter becomes uniform in frequency characteristic, the magnetic field strength obtainable from the loop is independent from the signal frequency and therefore a standard magnetic field which is uniform in strength for a wide frequency range can be obtained.

An explanation of performance of the standard magnetic field generator according to the present invention is made in detail on a basis of an embodiment having a feeding circuit 31 shown in FIG. 6. Although the standard magnetic field generator shown in FIG. 6 depends on a parallel circuit of a high frequency oscillator 4 and a high frequency voltmeter 9 used as an indicator instead of a series circuit of an oscillator and an ammeter such as used for the standard magnetic field generators shown in FIGS. 4 and 5, a relationship which will be clarified hereinafter naturally applies to both embodiments using the voltmeter and the ammeter. Further the loop antenna shown in FIG. 6(a) is not essentially different from that shown in FIG. 5(a).

It is assumed that a signal generated by an oscillator 4 in the feeding circuit 31 of the standard loop antenna constructed as shown in FIG. 6 is fed to a loop 11 through a high frequency voltmeter 9, a source resistor 8, a feeding line 12 and a terminal resistor 7.

In case where all of the source resistor 8 and the terminal resistor 7, the feeding line 12 and the high frequency voltmeter 9 are uniform in frequency characteristics and the impedance $R_s$ of the resistor 8 is equal to a characteristic impedance $Z_o$ of the feeding line 12, the current "I" flowing through the loop 11 is given by the following equation;

$$I = \frac{V_s}{(Z_o + R_L)\sqrt{1 + (\frac{2\pi fL}{Z_o + R_L})^2}} \quad (2)$$

wherein "$L$" is the self-inductance of the loop 11 and $R_L$ is the resistance value of the terminal resistor 7. On the other hand, in most cases, the distance "$d$" between the standard magnetic field generator and the antenna of a device to be tested is predetermined as a specific value according to the other measurement conditions. Therefore, if impedance $Z_o$ and resistance value $R_L$ are determined such that the following equation (3) is satisfied for a given distance "$d_o$", the following equation (4) showing the magnetic field strength H at the distance "$d_o$" can be given from the above mentioned equations (1) and (2) which clarify the relationships (1) between the loop current "I" and the magnetic field strength "H" and (2) between the loop current "I" and the indication value "$V_s$" of the voltmeter. It can be acknowledged from the equation (4) that the respective undesirable factors due to the frequency characteristics are eliminated.

$$Z_o + R_L = \frac{c \cdot L}{d_o} \quad (3)$$

$$H = \frac{K \cdot V_s}{(Z_o + R_L)} \quad (4)$$

FIG. 8 illustrates another embodiment of the present invention in which the terminal resistor 7 is grounded through a transmission line 12d provided in the loop 11. In case where the resistance value $R_L$ of the resistor 7 is equal to $Z_n$, this embodiment is equivalent to that shown in FIG. 5 or 6. Even in case where $R_L$ is not equal to $Z_n$, the intended loop type wide range standard magnetic field generator is obtained by determining the resistance value $R_L$ of the resistor 7 for an equivalent inductance equivalent to the composite reactance of the transmission line 12d and the self-inductance of the loop 11, according to the above described principle of the present invention. In the embodiment shown in FIG. 8, it is possible to obtain the advantage that, by using a connector, the resistor 7 can be easily replaced.

As will be clearly understood from the foregoing description of the present invention, the loop type wide range standard magnetic field generator according to the present invention can produce a constant standard magnetic field over a wide range of frequencies by selecting the length of the transmission line and/or the impedance of the element connected thereto so that the ratio of the magnetic field strength at a given point to the current flowing through the loop which is read out from an indication value of an indicator such as an ammeter or a voltmeter connected to the loop via the transmission line is uniform in frequency characteristic.

What is claimed as new and desired to be secured by Letters patent of the United States is:

1. A loop type standard magnetic field generator comprising:
   a loop having two paired signal feeding points formed by cutting away a portion thereof;
   a two-wire feeding line, one end of each wire of said feeding line being connected to one end of one of said paired signal feeding points of said loop;
   a signal generation circuit, a first terminal of said signal generation circuit being connected to the other end of one wire of said feeding line and a second terminal of said signal generation circuit being connected to the other end of the other wire of said feeding line and composed of an oscillator supplying a signal to said loop to generate a loop current;
   a two-wire transmission line, one end of each wire of said transmission line being connected to the other end of the other of said paired signal feeding points of said loop;

a compensation circuit composed of a compensation resistor and an indicator for measuring the loop current supplied from said signal generation circuit, a first terminal of said compensation circuit being connected to the other end of one wire of said transmission line;

one end and the other end of the other wire of said transmission line being respectively connected to the one end of the other wire of said feeding line and to a second terminal of said compensation circuit;

the length of said transmission line and the resistance value of said compensation resistor being selected so that the frequency characteristic of a ratio of the indicated value of said indicator to the loop current flowing through said loop is cancelled by the frequency characteristic of a ratio of the loop current to a magnetic field strength at a given point.

2. A loop type standard magnetic field generator as set forth in claim 1, wherein said indicator is a high frequency ammeter.

3. A loop type standard magnetic field generator as set forth in claim 1, wherein said feeding line and said transmission line are extended outwardly from a point on said loop which is out-of-phase with respect to said feeding points by 180°.

4. A loop type standard magnetic field generator comprising:
   a loop having a pair of signal feeding points formed by cutting away a portion thereof;
   a two-wire feeding line, one end of one wire of said feeding line being connected to one of said signal feeding points of said loop;
   a signal generation circuit, a first terminal of said signal generation circuit being connected to the other end of said one wire of said feeding line and a second terminal of said signal generation circuit being connected to the other end of the other wire of said feeding line and composed of an oscillator supplying a signal to said loop to generate a loop current through said feeding line and an indicator for measuring the loop current;
   a terminal resistor, one end of which is connected to the other of said signal feeding points of said loop and the other end of which is connected to the second terminal of said signal generation circuit through the other wire of said feeding line;
   the length of said feeding line and the resistance value of said terminal resistor being selected so that the frequency characteristic of the ratio of the indicated value of said indicator to the loop current flowing through said loop is cancelled by the frequency characteristic of the ratio of the loop current to the magnetic field strength at a given point.

5. A loop type standard magnetic field generator comprising:
   a loop having a pair of signal feeding points formed by cutting away a portion thereof;
   a two-wire feeding line, one end of one wire of said feeding line being connected to one of said signal feeding points of said loop;
   a signal generation circuit, a first terminal of said signal generation circuit being connected to the other end of said one wire of said feeding line and a second terminal of said signal generation circuit being connected to the other end of the other wire of said feeding line and composed of an oscillator supplying a signal to said loop to generate a loop current through said feeding line, an indicator for measuring the loop current and a source resistor having a resistance value matched with said feeding line;
   a terminal resistor, one end of which is connected to the other of said signal feeding points of said loop and the other end of which is connected to the second terminal of said signal generation circuit through the other wire of said feeding line;
   the value of said source resistor being selected so that the frequency characteristic of the ratio of the indicated value of said indicator to the loop current flowing through said loop is cancelled by the frequency characteristic of the ratio of the loop current to the magnetic field strength at a given point.

6. A loop type standard magnetic field generator as set forth in claim 5, wherein said indicator is a high frequency voltmeter and arranged in parallel relative to said oscillator.

7. A loop type standard magnetic field generator comprising:
   a loop having a pair of signal feeding points formed by cutting away a portion thereof;
   a two-wire feeding line, one end of one wire of said feeding line being connected to one of said signal feeding points of said loop;
   a signal generation circuit, a first terminal of said signal generation circuit being connected to the other end of said one wire of said feeding line and a second terminal of said signal generation circuit being connected to the other end of the other wire of said feeding line and composed of an oscillator supplying a signal to said loop to generate a loop current through said feeding line and an indicator for measuring the loop current and a source resistor having a resistance value matched with said feeding line;
   a two-wire transmission line, one end of one wire of said transmission line being connected to the other of said signal feeding points and one end of the other wire of said transmission line being connected to said one end of the other wire of said feeding line;
   a terminal resistor, one end of said terminal resistor being connected to the other end of said one wire of said transmission line and the other end of said terminal resistor being connected to said other end of the other wire of said transmission line;
   the length of said transmission line and the resistance value of said source resistor being selected so that the frequency characteristic of a ratio of the indicated value of said indicator to the loop current flowing through said loop is cancelled by the frequency characteristic of a ratio of the loop current to a magnetic field strength at a given point.

8. A loop type standard magnetic field generator comprising:
   a loop having a pair of signal feeding points formed by cutting away a portion thereof;
   a two-wire feeding line, one end of one wire of said feeding line being connected to one of said signal feeding points of said loop;
   a signal generation circuit, a first terminal of said signal generation circuit being connected to the other end of said one wire of said feeding line and a second terminal of said signal generation circuit being connected to the other end of the other wire of said feeding line and composed of an oscillator supplying a signal to said loop to generate a loop current through said feeding line and an indicator for measuring the loop current and a source resistor having a resistance value matched with said feeding line;

a two-wire transmission line, one end of one wire of said transmission line being connected to the other of said signal feeding points and one end of the other wire of said transmission line being connected to said one end of the other wire of said feeding line;

a connector, one end of said connector being connected to the other end of said wire of said transmission line and the other end of said connector being connected to said other end of the other wire of said transmission line;

the length of said transmission line and the resistance value of said source resistor being selected so that the frequency characteristic of a ratio of the indicated value of said indicator to the loop current flowing through said loop is cancelled by the frequency characteristic of a ratio of the loop current to a magnetic field strength at a given point.

* * * * *